(12) United States Patent
Kim et al.

(10) Patent No.: US 9,609,736 B2
(45) Date of Patent: Mar. 28, 2017

(54) TOUCH PANEL AND METHOD OF MANUFACTURING THE SAME

(71) Applicant: LG INNOTEK CO., LTD., Seoul (KR)

(72) Inventors: Jin Bok Kim, Seoul (KR); Do Young Kim, Seoul (KR); Min Su Choe, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 385 days.

(21) Appl. No.: 13/932,548

(22) Filed: Jul. 1, 2013

(65) Prior Publication Data

US 2014/0000939 A1    Jan. 2, 2014

(30) Foreign Application Priority Data

Jun. 29, 2012 (KR) .................. 10-2012-0070703
Nov. 8, 2012 (KR) .................. 10-2012-0126202

(51) Int. Cl.

| | |
|---|---|
| *H05K 1/00* | (2006.01) |
| *H05K 1/09* | (2006.01) |
| *G06F 3/041* | (2006.01) |
| *G06F 3/045* | (2006.01) |
| *H05K 1/02* | (2006.01) |
| *G06F 3/044* | (2006.01) |

(52) U.S. Cl.
CPC .............. *H05K 1/02* (2013.01); *G06F 3/044* (2013.01); *G06F 2203/04107* (2013.01)

(58) Field of Classification Search
CPC ..... G06F 2203/044; G06F 2203/04107; G06F 3/044; H05K 1/02

USPC .................. 345/173, 174; 174/250, 257
See application file for complete search history.

(56) References Cited

U.S. PATENT DOCUMENTS

| | | | |
|---|---|---|---|
| 2003/0076308 A1* | 4/2003 | Sano et al. ................ | 345/177 |
| 2009/0314621 A1* | 12/2009 | Hotelling ................ | 200/600 |
| 2011/0254802 A1* | 10/2011 | Philipp ................ | G06F 3/0412 |
| | | | 345/174 |

(Continued)

FOREIGN PATENT DOCUMENTS

| | | |
|---|---|---|
| KR | 2010-0085711 A | 7/2010 |
| KR | 101081110 B1 | 11/2011 |

OTHER PUBLICATIONS

Office Action dated Dec. 18, 2013 in Korean Application No. 10-2012-0126202.

*Primary Examiner* — Sherman Ng
(74) *Attorney, Agent, or Firm* — Saliwanchik, Lloyd & Eisenschenk

(57) ABSTRACT

Disclosed are a touch panel and a method of manufacturing the same. A touch panel includes: a substrate on which an active area and an inactive area are defined, in which the substrate includes a first lateral side, a second lateral side, a third lateral side, and a fourth lateral side surrounding the active area and the inactive area is disposed at only two of the first lateral side, the second lateral side, the third lateral side, and the fourth lateral side; a sensing electrode pattern on the active area; and a wire pattern connected to the sensing electrode pattern, wherein the wire pattern is disposed at the inactive area. A use region on a front surface of the touch panel is maximized by removing a bezel formed at a side of the touch panel to improve convenience of a user.

9 Claims, 15 Drawing Sheets

(56) References Cited

U.S. PATENT DOCUMENTS

| | | | | |
|---|---|---|---|---|
| 2011/0261003 | A1* | 10/2011 | Lee | G02F 1/13338 345/174 |
| 2011/0304566 | A1* | 12/2011 | Han | G06F 3/0416 345/173 |
| 2012/0013544 | A1* | 1/2012 | Philipp | G06F 3/041 345/173 |
| 2012/0026126 | A1* | 2/2012 | Park | G06F 3/044 345/174 |
| 2012/0103777 | A1* | 5/2012 | Kang | 200/600 |
| 2012/0227259 | A1* | 9/2012 | Badaye et al. | 29/846 |
| 2012/0229395 | A1* | 9/2012 | Shin | G06F 3/0418 345/173 |
| 2012/0249436 | A1* | 10/2012 | Choi | G02F 1/13338 345/173 |
| 2013/0021268 | A1* | 1/2013 | Lee | G06F 3/0416 345/173 |
| 2013/0100038 | A1* | 4/2013 | Yilmaz et al. | 345/173 |
| 2013/0100041 | A1* | 4/2013 | Golovchenko et al. | 345/173 |
| 2013/0154991 | A1* | 6/2013 | Yilmaz | 345/174 |
| 2013/0229364 | A1* | 9/2013 | Yu et al. | 345/173 |

* cited by examiner

TOUCH PANEL AND METHOD OF MANUFACTURING THE SAME

CROSS-REFERENCE TO RELATED APPLICATIONS

This application claims the benefit under 35 U.S.C. §119 of Korean Patent Application No. 10-2012-0070703, filed Jun. 29, 2012, and Korean Patent Application No. 10-2012-0126202, filed Nov. 8, 2012, which are hereby incorporated by reference in their entirety.

BACKGROUND

The embodiment relates to a touch panel and a method of manufacturing the same. More particularly, the embodiment relates to a touch panel capable of improving convenience of a user and a method of manufacturing the same.

A touch panel including an input unit (pointing device) has been extensively used in displays of electronic devices such as personal digital assistants (PDA), a notebook computer, office automation (OA) device, a medical device, or an automobile navigation system. For example, a capacitive touch panel, a resistive touch panel, an electromagnetic induction touch panel, and an optical touch panel are generally known in the art. Recently, resistive touch panel has been extensively used.

A front surface of the touch panel is generally defined by an active area to which a touch command of a user can be input and an inactive area to which the touch command of the user can be input. A bezel is included in the inactive area.

BRIEF SUMMARY

An embodiment provides a touch panel, which enlarges a use region on a front surface of the touch panel by removing a bezel formed at a side of the touch panel to improve convenience of a user, and reduces a manufacturing cost of the touch panel by miniaturizing unnecessary wire electrodes and unnecessary printing patterns and arraying a plurality of touch panels on a touch panel production sheet, and a method of manufacturing the same.

The embodiment provides a touch panel having improved reliability by reducing the number of bonding parts, and a method of manufacturing the same.

According to the embodiment, there is provided a touch panel including: a sensing electrode pattern on an active area; and a wire pattern connected to the sensing electrode pattern, wherein the wire pattern is disposed on a region of the active area except for a lateral side of the active area.

The wire pattern may be disposed at a top end or a bottom end of the active area.

The wire pattern may be disposed on a region in which an FPCB bonding part is provided.

An end of the sensing electrode pattern is formed toward a top end or a bottom end of the active area and is connected to the wire pattern.

The touch panel may include: an electrode pattern layer in which a first sensing electrode pattern and a second sensing electrode pattern are formed; an adhesive material layer on the sensing electrode pattern layer; and a transparent window adhering onto the adhesive material layer, wherein the first sensing electrode pattern and the second sensing electrode pattern have directionality toward a top end or a bottom end of the touch panel.

The touch panel may include a first sensing electrode pattern layer in which a first sensing electrode pattern is formed; an insulating layer on the first sensing electrode pattern layer; a second sensing electrode pattern layer formed on the insulating layer and in which a second sensing electrode pattern is provided; an adhesive material layer on the second sensing electrode pattern layer; and a transparent window adhering onto the adhesive material layer, wherein the first sensing electrode pattern and the second sensing electrode pattern have directionality toward a top end or a bottom end of the touch panel.

The first sensing electrode pattern and the second sensing electrode pattern may have a pulse shape, a zig-zag shape, a polygonal shape, or a combination of the polygonal shape and a line.

The touch panel may further include a printing pattern disposed at a top end or a bottom end of the active area of the touch panel on the transparent window.

A method of manufacturing the touch panel according to the embodiment includes forming a sensing electrode pattern on an active area of the touch panel; and forming a wire pattern connected to the sensing electrode pattern at a region of the active area except for a lateral side of the active area.

The wire pattern may be disposed at a top end or a bottom end of the active area.

The wire pattern may be disposed on a region in which an FPCB bonding part is provided.

An end of the sensing electrode pattern may be formed toward a top end or a lower end of the active area.

The sensing electrode pattern may be disposed to have directionality toward a top end or a bottom end of the touch panel.

The first sensing electrode pattern and the second sensing electrode pattern may have a diamond shape, a block shape, a bar shape, a pulse shape, a zig-zag shape, a polygonal shape, or a combination of the polygonal shape and a line.

According to another embodiment, there is provided a touch panel including: a substrate on which an active area and an inactive area disposed at a top end or a bottom end of the active area are defined; a sensing electrode detecting a position in the active area; a wire connected to the sensing electrode; a plurality of ground electrodes identifying an electric signal from the sensing electrode; a first pad part placed at an end of the wire and connected to a circuit board; and a second pad part placed at one end of at least one of the ground electrodes, and connected to the circuit board, wherein the number of the second pad part is smaller than the number of the ground electrodes.

According to the embodiment, a use region on a front surface of the touch panel can be maximized by removing a bezel formed at a side of the touch panel to improve convenience of a user.

Further, according to the embodiment, a manufacturing cost of the touch panel can be reduced by minimizing unnecessary wire electrodes and printing patterns and arraying a greater amount of touch panels on a touch panel production sheet.

In addition, according to the embodiment, when both of a sensing electrode and a ground electrode are aligned on the same plane, the number of bonding parts between the sensing electrode and the circuit board and between the ground electrode and the circuit board can be reduced. That is, a structure advantageous for bonding can be ensured by reducing a width of the bonding part.

DETAILED DESCRIPTION

Figure 1:
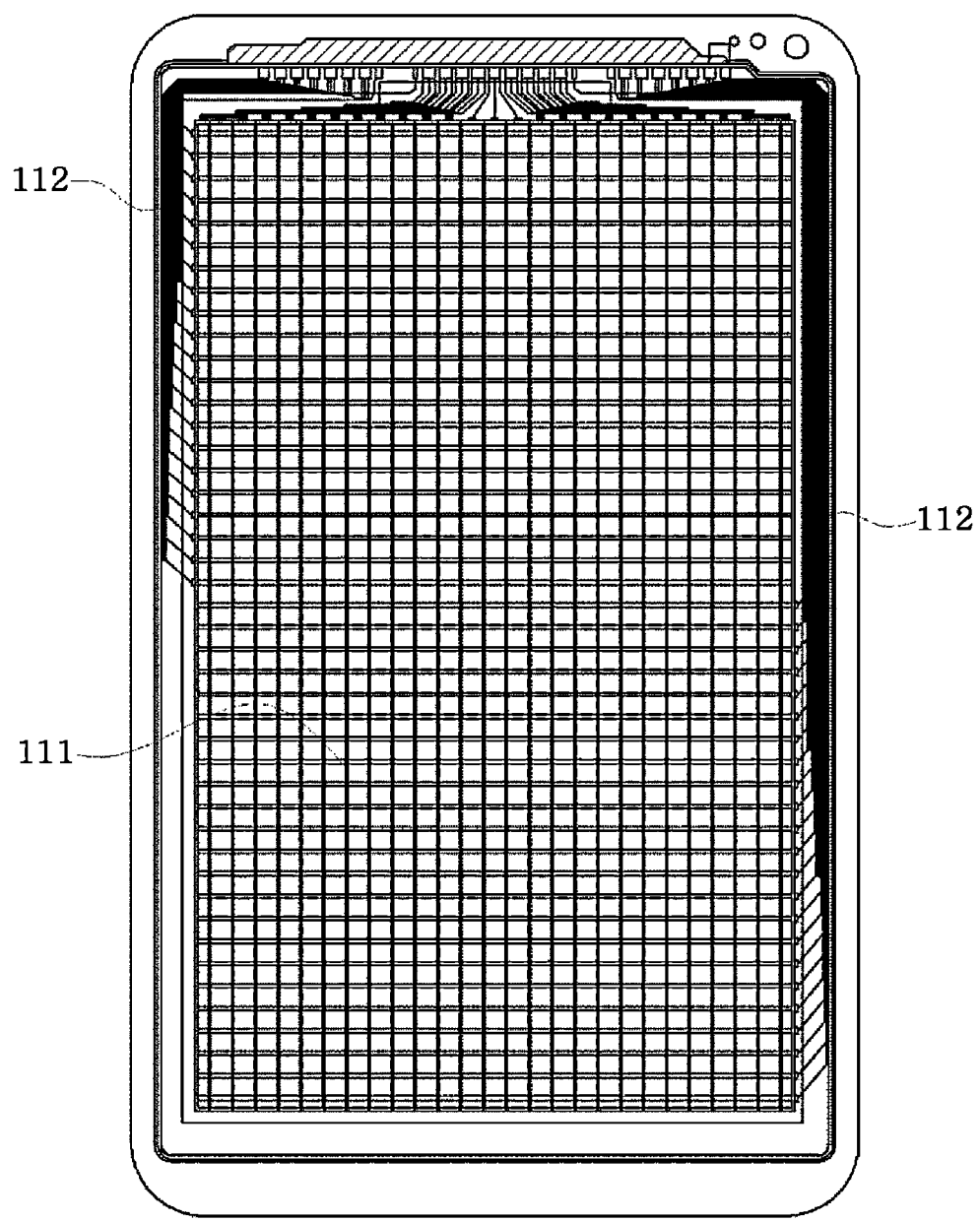
FIG. 1 is a view illustrating a touch panel according to an embodiment.

Hereinafter, a touch panel according to the exemplary embodiment will be described in detail with reference to accompanying drawings. In a description of the embodiment, if the function or the structure related to the disclosure and generally known to those skilled in the art make the subject matter of the disclosure unclear, the details of the function or the structure will be omitted. The size of the elements shown in the drawings may be exaggerated for the purpose of explanation and may not utterly reflect the actual size.

FIG. 1 is a view illustrating a touch panel according to an embodiment. Referring to FIG. 1, the touch panel according to the embodiment will be described.

As shown in FIG. 1, in the touch panel according to the embodiment, a sensing electrode pattern 215 is provided on an active region, and a wire pattern 260 connected to the sensing electrode pattern 215 is provided.

Referring to FIG. 1, the sensing electrode pattern 215 includes a first sensing electrode pattern 211 and a second sensing electrode pattern 231. The first sensing electrode pattern 211 may include a connecting part 211a and a sensor part 211b. The connecting part 211a and the sensor part 211b may extend in a first direction. The second sensing electrode pattern 231 may extend in a second direction crossing the first direction. In this case, the second sensing electrode pattern 231 may extend through the connecting part 211a.

In this case, according to the embodiment, the active region signifies an area to which a touch command of a user can be input. To the contrary to the active area to which the touch command of the user can be input, the inactive area signifies an area to which the touch command is not input because the ineffective area is not activated even if the touch of the user is input thereto.

In the embodiment, a first lateral side, a second lateral side, a third lateral side, and a fourth lateral side surrounding the active area are defined and the inactive area is disposed at only two of the first lateral side, the second lateral side, the third lateral side, and the fourth lateral side. In detail, the inactive area is disposed at one of upper and lower portions of the active area and at one of left and right sides of the active area.

Therefore, according to the embodiment, the wire pattern 260 is disposed at one of upper and lower portions of the touch panel and at one of left and right sides of the touch panel. That is, according to the related art, wire patterns 260 are formed at both of left and right sides of the active area of the touch panel, so bezel areas are essentially formed at the left and right sides of the touch panel.

However, according to the embodiment, the wire pattern 260 is formed at only two of the first lateral side, the second lateral side, the third lateral side, and the fourth lateral side. In general, since an FPCB bonding part 230 is formed at the top end T of the active area of the touch panel, if the wire pattern 260 is formed at the FPCB bonding part 230, a wire pattern is formed at one of left and right sides of the active area as shown in FIG. 1 so that the wire pattern 260 may be miniaturized. Therefore, according to the embodiment, the active area of the touch panel can be enlarged by miniaturizing a bezel on the touch panel.

In this manner, if the bezel of the touch panel is miniaturized, since a printing pattern is not necessary to be formed on a transparent window, the number of processes can be reduced.

In addition, as shown in FIG. 1, a separate printing pattern is not necessary at a bottom end of the touch panel, so the convenience of the user can be improved by enlarging the active area of the touch panel.

Meanwhile, although the embodiment of FIG. 1 has illustrated that the wire pattern 260 is formed at the top end of the touch panel, the wire pattern 260 may be formed at a bottom end of the touch panel when an FPCB bonding part 230 is provided at a bottom end of the touch panel due to a structural reason. The wire pattern 260 may be disposed at a bottom end of the touch panel if it is advantageous for structural reasons.

FIGS. 2 to 5 are views illustrating a touch panel according to the embodiment.

Figure 2:
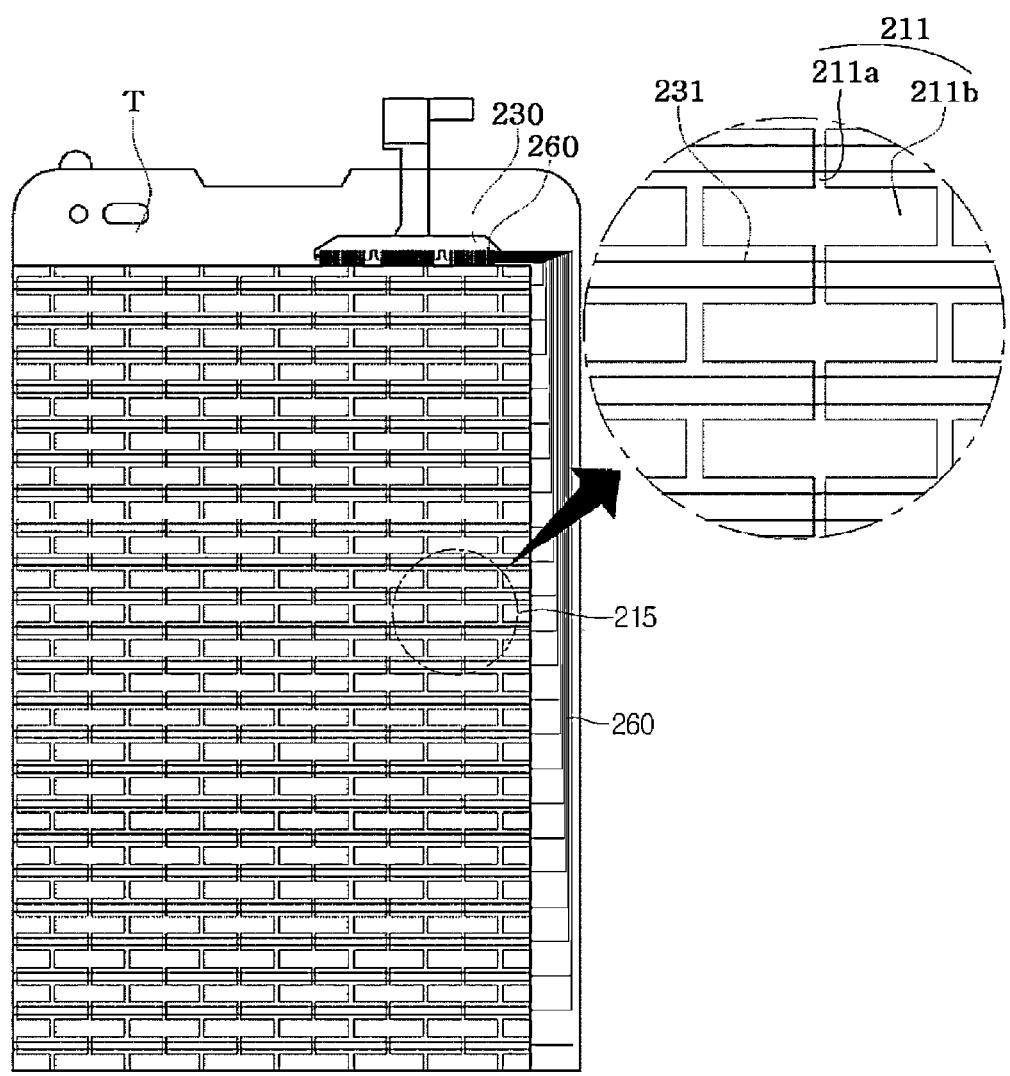
FIGS. 2 to 5 are views illustrating a touch panel according to the embodiment.

As shown in FIG. 2, the touch panel according to the embodiment includes a first sensing electrode pattern layer 210, an insulating layer 270, a second sensing electrode pattern layer 230, an adhesive material layer 280, and a transparent window 250.

A first sensing electrode pattern 211 is formed in the first sensing electrode pattern layer 210.

The insulating layer 270 is disposed on the first sensing electrode pattern layer 210, and the second sensing electrode pattern layer 230 is formed on the insulating layer 270.

A second sensing electrode pattern 231 is formed in the second sensing electrode pattern layer 230.

The adhesive material layer 280 is formed on the second sensing electrode pattern layer 230 so that the transparent window 250 adheres on the adhesive material layer 280.

The first sensing electrode pattern 211 and the second sensing electrode pattern 231 formed as described above are illustrated in FIG. 3. The first sensing electrode pattern 211 formed in the first sensing electrode pattern layer 210 is illustrated in FIG. 4. The second sensing electrode pattern 231 formed in the second sensing electrode pattern layer 230 is illustrated in FIG. 5.

Figure 3:
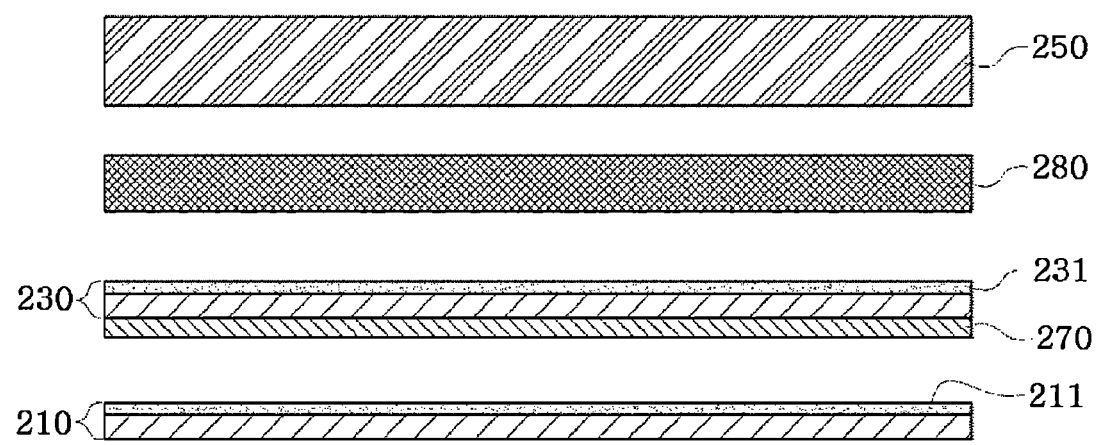
Figure 4:
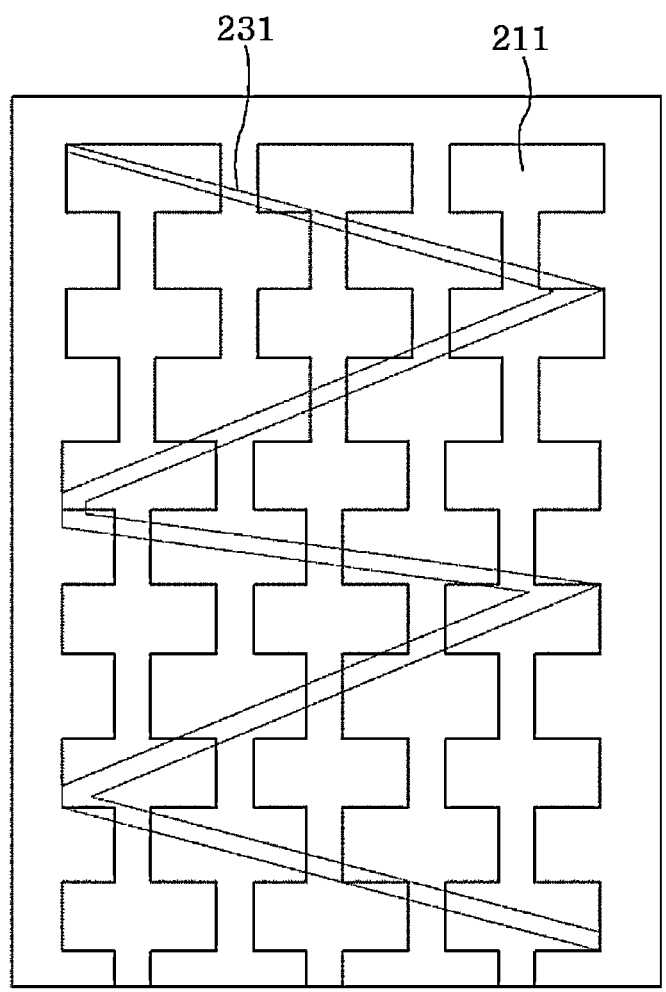
Figure 5:
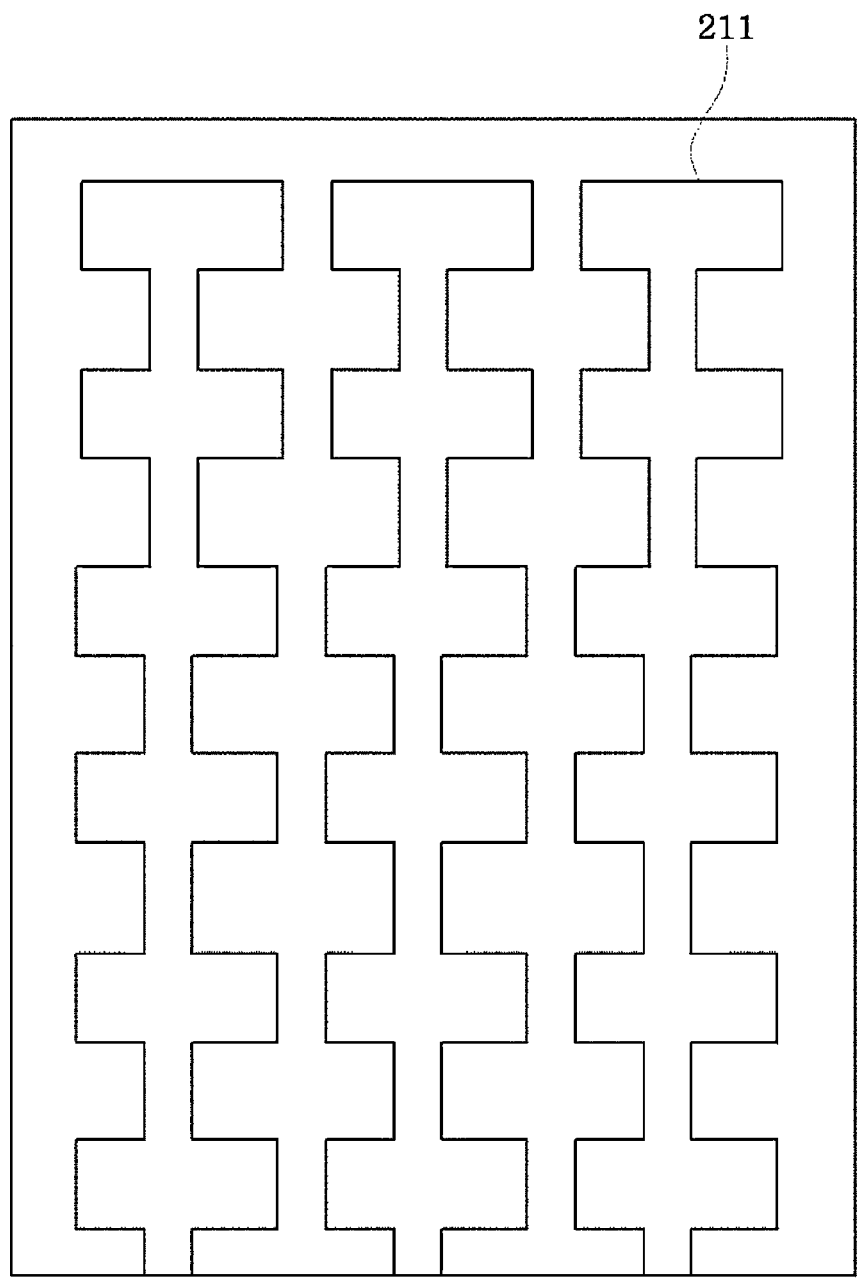

As shown in FIGS. 3 to 5, the first sensing electrode pattern 211 and the second sensing electrode pattern 231 are disposed to have directionality toward the top end or the bottom end of the touch panel. An end of each sensing electrode pattern is formed toward the top end or the bottom end of the active area of the touch panel so that a wire pattern is formed at the end of the sensing electrode.

Meanwhile, as shown in FIG. 4, the first sensing electrode pattern 211 may have a hammer shape. As shown in FIG. 5, the second sensing electrode pattern 231 may have a zig-zag shape.

Further, the first sensing electrode pattern 211 and the second sensing electrode pattern 231 may have various shapes such as a diamond shape, a block shape, a bar shape, a pulse shape, a zig-zag shape, a polygonal shape such as a triangular shape or a square shape, or a combination of the polygonal shape and a line as well as the above shapes.

FIGS. 6 to 9 are views illustrating a touch panel according to the embodiment.

Figure 6:
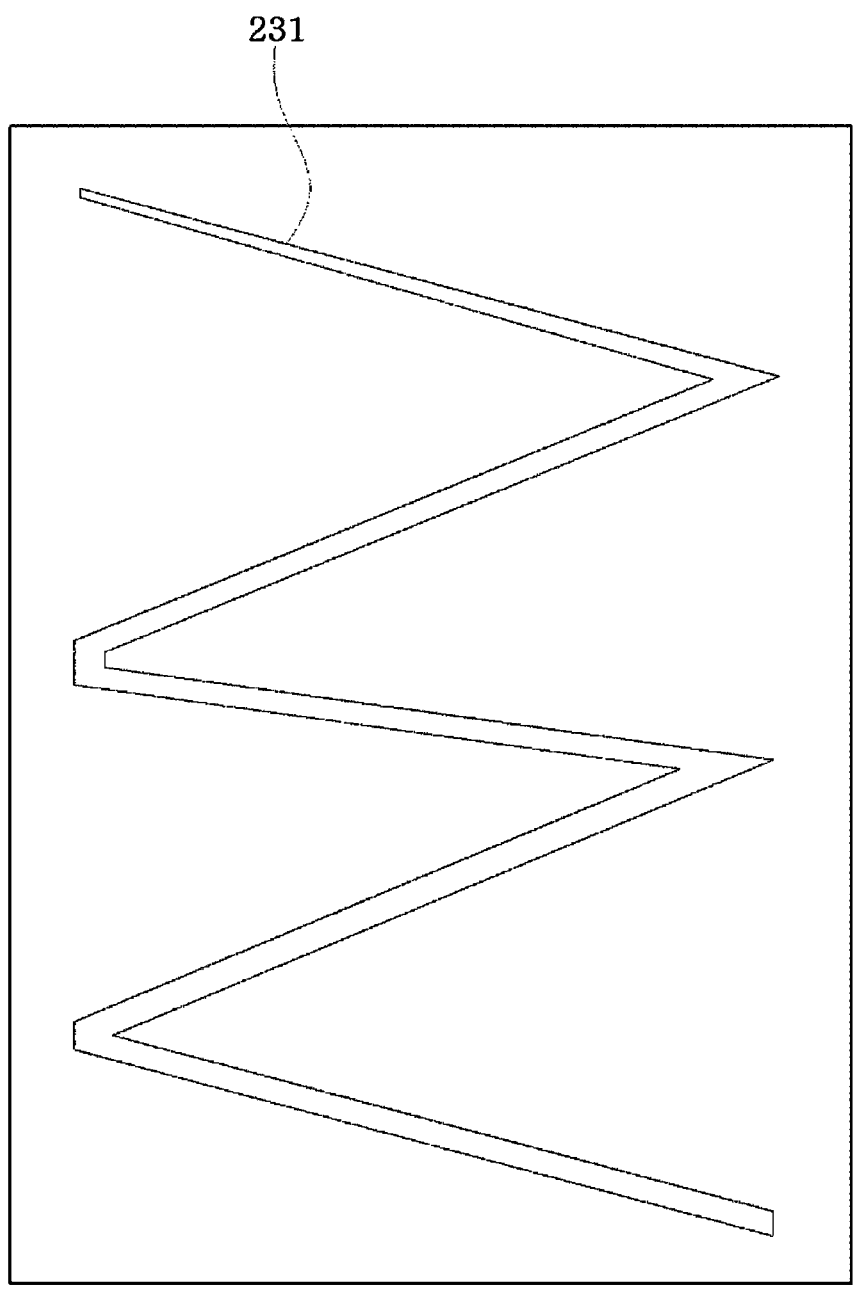
FIGS. 6 to 10 are views illustrating a touch panel according to the embodiment.

As shown in FIG. 6, the touch panel according to the embodiment includes a sensing electrode pattern layer 210, an adhesive material layer 280, and a transparent window 250.

The first sensing electrode pattern 211 and the second sensing electrode pattern 231 are formed together in the sensing electrode pattern layer.

The adhesive material layer 280 is formed on the sensing electrode pattern layer 210 so that the transparent window 250 adheres on the adhesive material layer 280.

Figure 7:
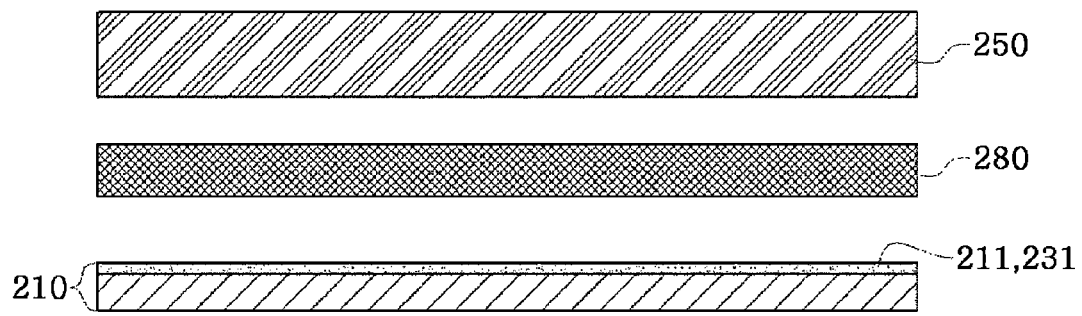

That is, as shown in FIG. 6, even in the embodiment in which the first sensing electrode pattern 211 and the second sensing electrode pattern 231 are formed together in one sensing electrode pattern layer 210, since a separate wire pattern is not formed on a lateral side of the touch panel but the wire pattern is disposed at a top end or a bottom end of the active area of the touch panel, the bezel may be removed from one lateral side of the touch panel as shown in FIG. 7.

Figure 8:
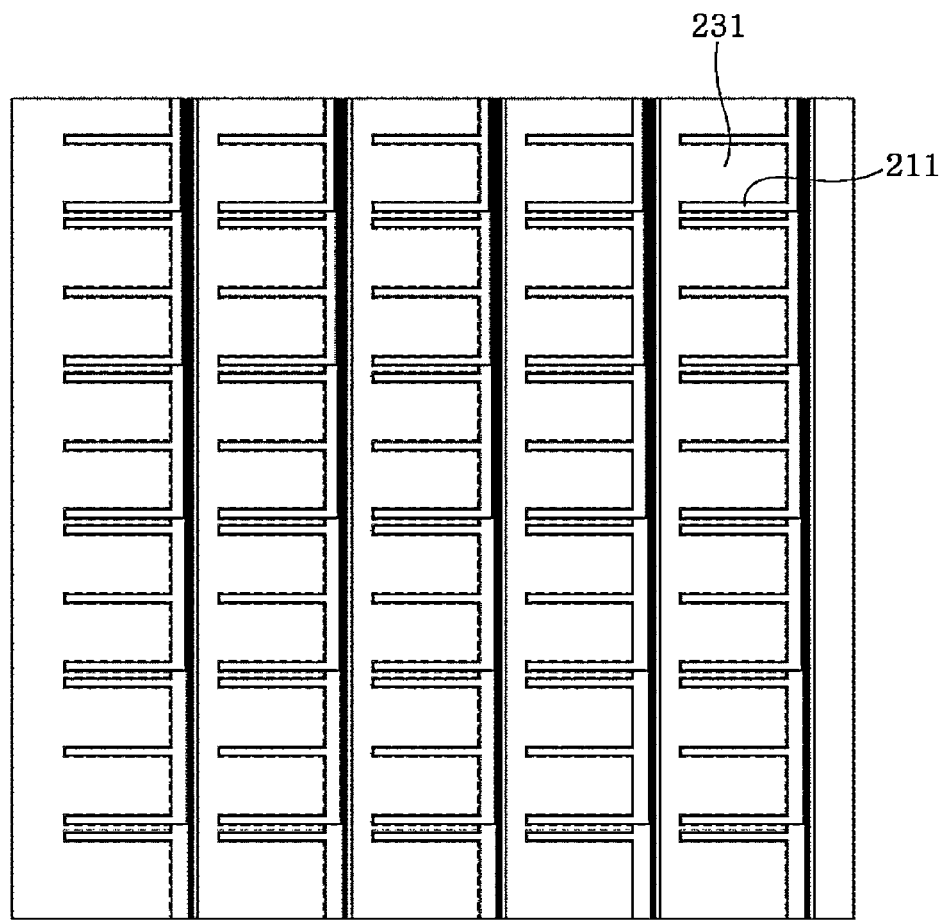

The first sensing electrode pattern 211 and the second sensing electrode pattern 231 are illustrated in FIG. 7. The first sensing electrode pattern 211 and the wire pattern 260 are illustrated in FIG. 8. The second sensing electrode pattern 231 and the wire pattern 260 are illustrated in FIG. 9.

Figure 9:
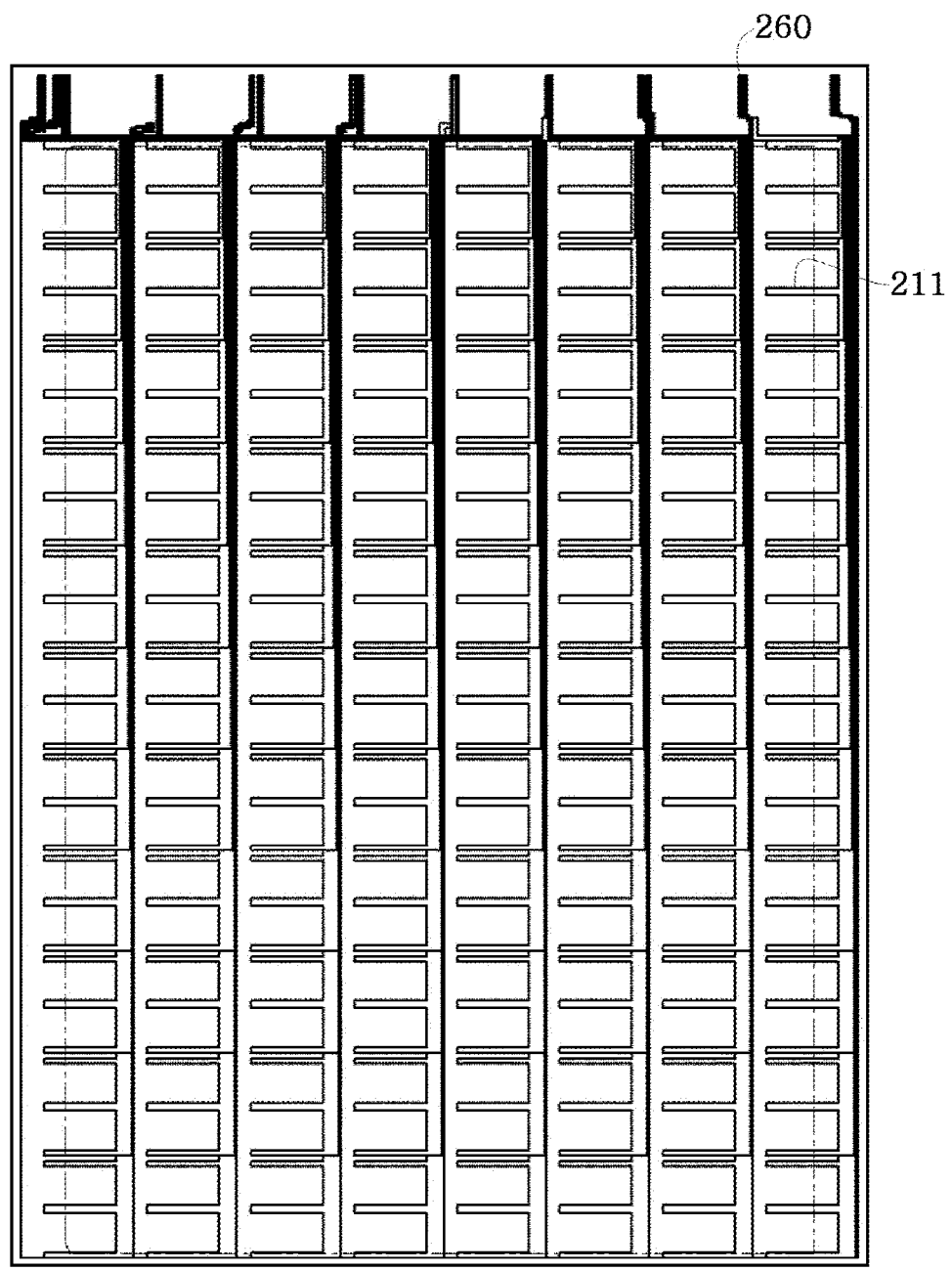

As shown in FIGS. 8 and 9, the first sensing electrode pattern 211 and the second sensing electrode pattern 231 are disposed to have directionality toward the top end or the bottom end of the touch panel. An end of each sensing electrode pattern is formed toward the top end or the bottom end of the active area of the touch panel so that a wire pattern 260 is formed at the end of the sensing electrode.

In this case, as shown in FIGS. 8 and 9, the first sensing electrode pattern 211 and the second sensing electrode pattern 231 may have a pulse shape.

Further, the first sensing electrode pattern 211 and the second sensing electrode pattern 231 may have various shapes such as a diamond shape, a block shape, a bar shape, a pulse shape, a zig-zag shape, a polygonal shape such as a triangular shape or a square shape, or a combination of the polygonal shape and a line as well as the above shapes.

As described above, the pattern having various shapes is disposed to have directionality toward the top end or the bottom end of the touch panel, and an end of each sensing electrode pattern is disposed at the top end or the bottom end of the touch panel, so a wire pattern connected to the sensing electrode pattern is placed at the top end or the bottom end of the touch panel. Therefore, a bezel may be removed from the lateral side of the touch panel, and accordingly, a use region on a front surface of the touch panel may be enlarged.

Hereinafter, the method of manufacturing the touch panel according to the embodiment will be described with reference to FIGS. 1, 3, and 7.

As shown in FIG. 1, the method of manufacturing the touch panel according to the embodiment includes forming a sensing electrode pattern 215 on an active area of the touch panel and forming a wire pattern 260 connected to the sensing electrode pattern 215 at only two of the first lateral side, the second lateral side, the third lateral side, and the fourth lateral side of the active area.

As shown in FIG. 1, an end of the sensing electrode pattern 215 is formed toward a top end or a bottom end of the active area, and the wire pattern 260 is connected to the end of the sensing electrode pattern 215.

In this case, the wire pattern 260 may be disposed at a top end T of the active area as shown in FIG. 1 or, according to another embodiment, may be disposed at a bottom end of the active area.

That is, the wire pattern 260 may be provide at the top end or the bottom end of the touch panel according to a position of an FPCB bonding part 230 of the touch panel.

That is, when the FPCB bonding part 230 is provided at the top end T of the active area, the wire pattern 260 may be provided at the top end T of the active area. When the FPCB bonding part 230 is formed at the bottom end of the active area, the wire pattern 260 may be formed at the bottom end of the active area.

Meanwhile, as shown in FIGS. 3 and 7, the sensing electrode pattern is disposed to have directionality toward a top end or a bottom end of the touch panel. The sensing electrode pattern may have a diamond shape, a block shape, a bar shape, a pulse shape, a zig-zag shape, a polygonal shape, or a combination of the polygonal shape and a line. In this manner, if the sensing electrode pattern has various shapes, the sensing electrode pattern may be formed in a single layer or a thickness of the touch panel may be reduced while blocking a noise.

Figure 10:
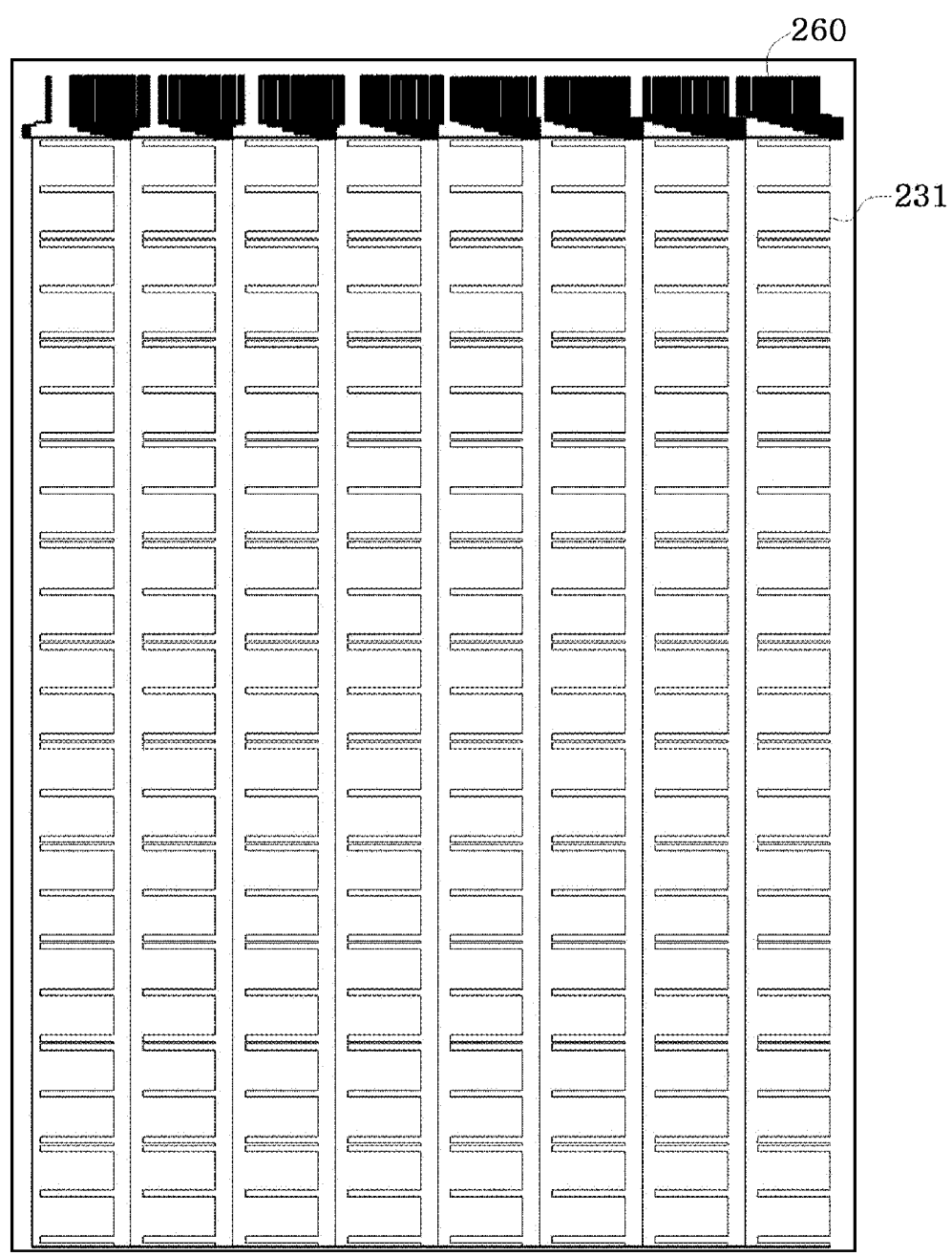
Figure 11:
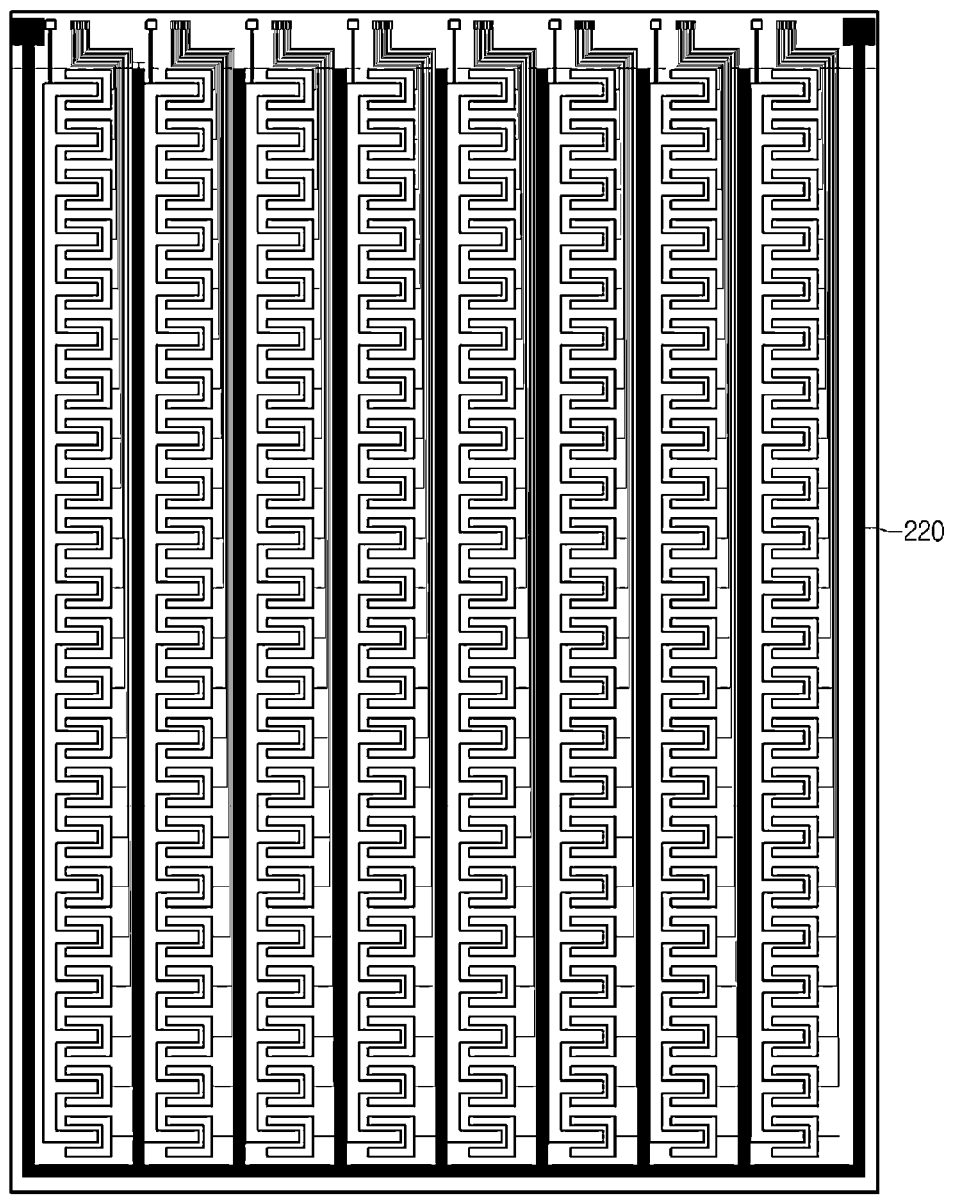
FIG. 11 is a plan view illustrating according to the embodiment.
Figure 12:
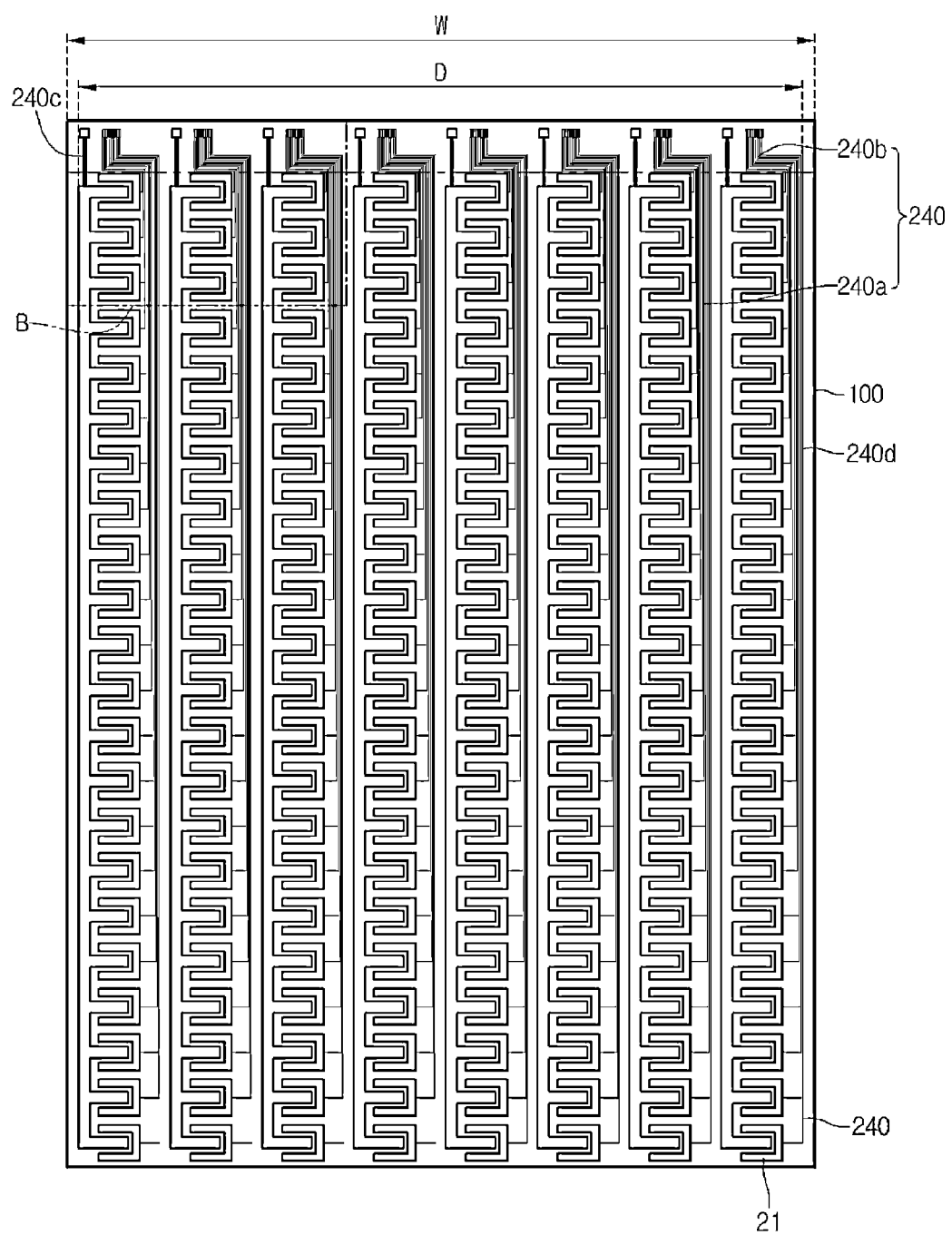
FIG. 12 is a plan view illustrating only a sensing electrode of FIG. 11.
Figure 13:
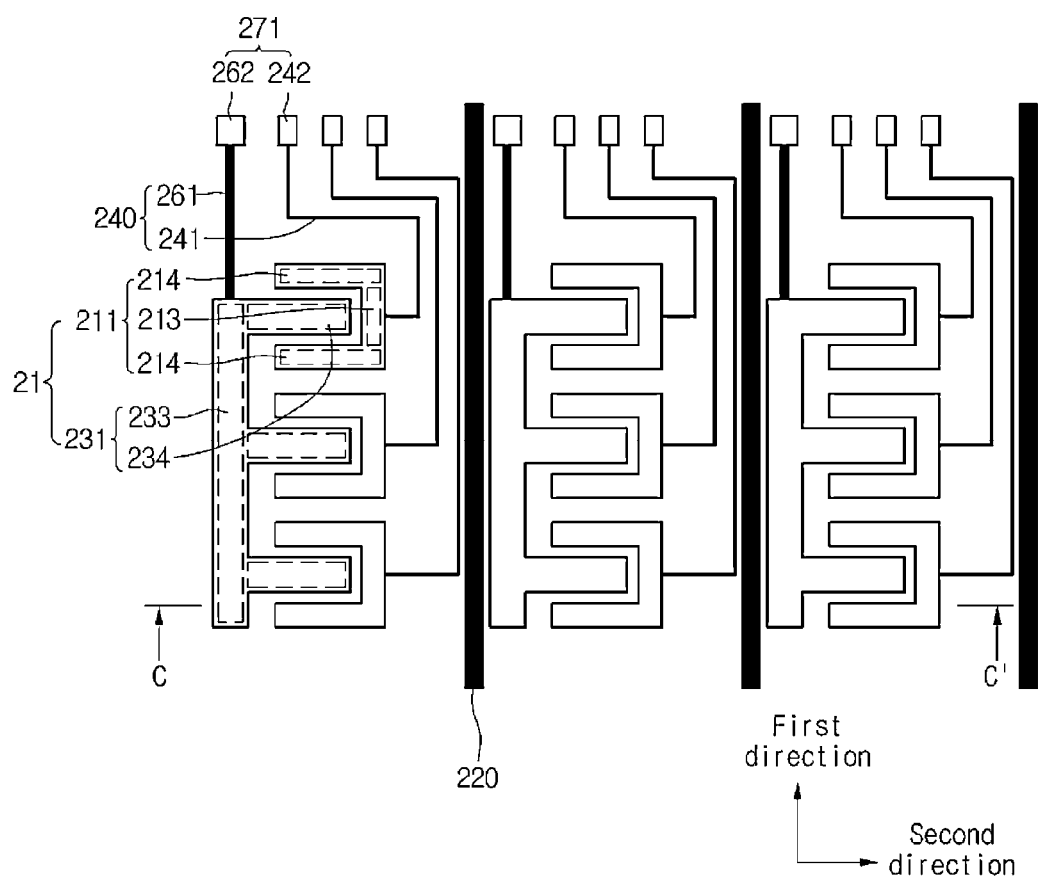
FIG. 13 is an enlarged plan view illustrating a region 'B' of FIG. 12.
Figure 14:
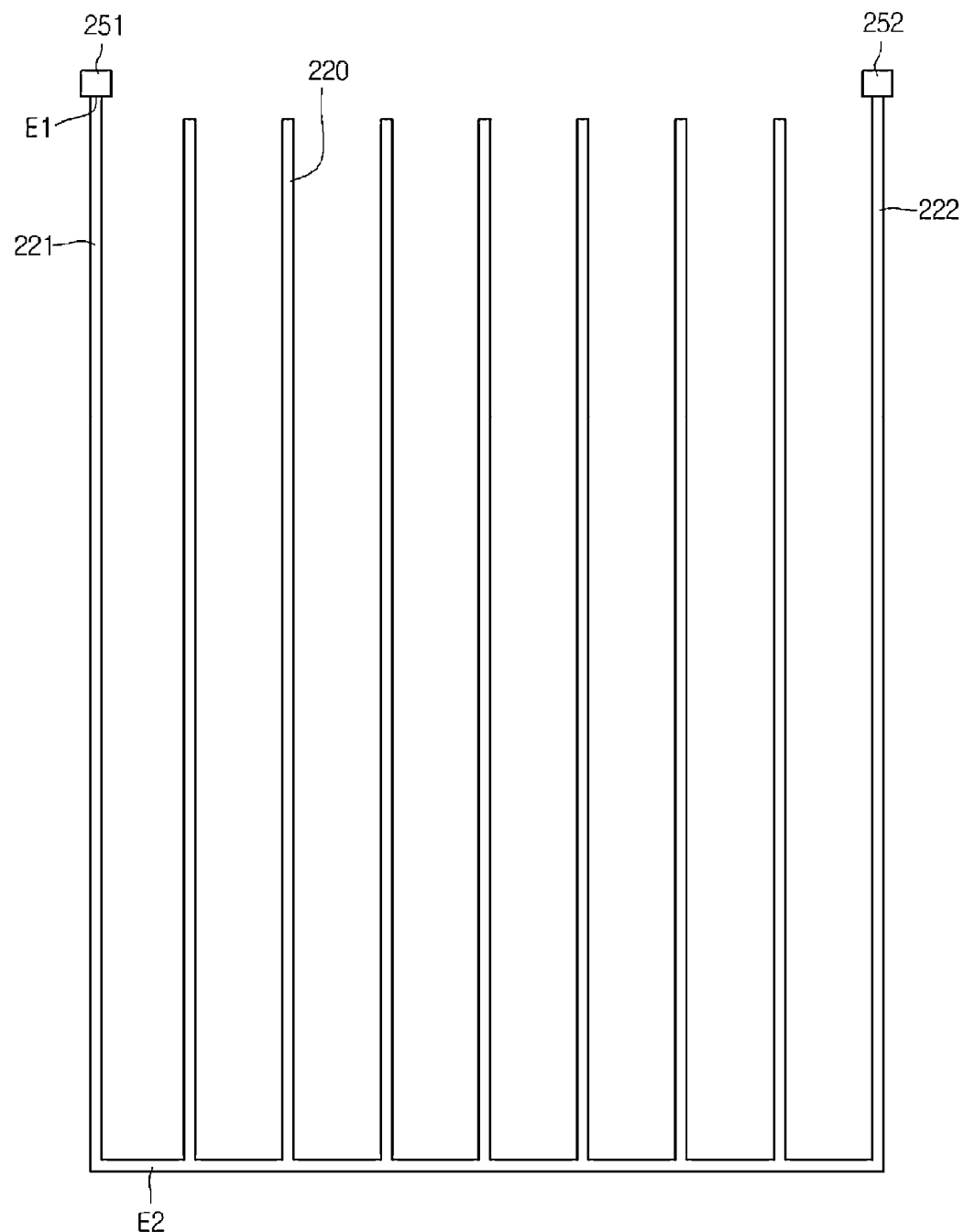
FIG. 14 is a plan view illustrating only a ground electrode of FIG. 11.
Figure 15:
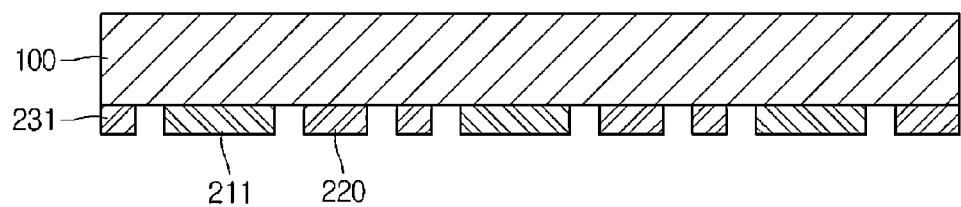
FIG. 15 is a sectional view taken along line C-C' of FIG. 13.
Figure 16:
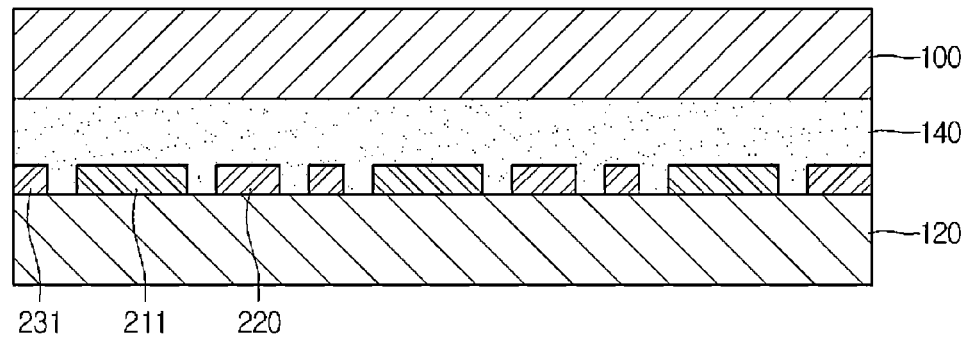
FIG. 16 is a sectional view illustrating a touch panel according to another embodiment.

The touch panel according to the embodiment will be described in detail with reference to FIGS. 10 to 16. FIG. 10 is a plan view illustrating according to the embodiment. FIG. 11 is a plan view illustrating only a sensing electrode of FIG. 10. FIG. 12 is an enlarged plan view illustrating a region 'B' of FIG. 11. FIG. 13 is a plan view illustrating only a ground electrode of FIG. 10. FIG. 14 is a sectional view taken along line C-C' of FIG. 12. FIG. 15 is a sectional view illustrating a touch panel according to another embodiment. FIG. 16 is a plan view illustrating a touch panel according to another embodiment.

Referring to FIGS. 9 to 14, the touch panel according to the embodiment includes a substrate 100, a sensing electrode 21, a ground electrode 220, a wire 240, a first pad part 271, second pad parts 251 and 252, and a circuit board.

The substrate 100 is defined by a first area and a second area. In this case, according to the embodiment, the first region signifies an area to which a touch command of a user can be input. To the contrary to the first area to which the touch command of the user can be input, the second area signifies an area to which the touch command is not input because the second area is not activated even if the touch of the user is input thereto.

Particularly, the wire 240 according to the embodiment is disposed at the minimum region of a lateral side of the touch panel. That is, according to the related art, wire patterns 260 are formed at both of left and right sides of the first area of the touch panel, so bezel areas are essentially formed at the left and right sides of the touch panel.

However, according to the embodiment, the wire 240 is disposed at the minimum region of the lateral side of the touch panel, and the second area is disposed in at least one lateral side of the first area. In detail, the second area is formed at a top end or a bottom end of the first area of the touch panel. In general, since a circuit board bonding part is formed at the top end T of the first area of the touch panel, if the wire 240 is formed at the circuit board bonding part, a wire 240 is formed at left and right sides of the first area as shown in FIG. 1 so that the wire 240 may be miniaturized. Therefore, according to the embodiment, the first area of the touch panel can be enlarged by miniaturizing a bezel on the touch panel.

In this manner, if the bezel of the touch panel is removed, since a printing pattern is not necessary to be formed on a transparent window, the number of processes can be reduced.

Meanwhile, one part of the wire 240 may include a transparent part 240a, and the other part of the wire 240 may include a metal part 240b.

In detail, the transparent part 240a is the wire 240 disposed in the first area. The transparent part 240a includes a transparent conductive material such that the transparent part is not visible in the touch panel. For example, the transparent part 240a may include a transparent conductive oxide such as an indium tin oxide, an indium zinc oxide, a copper oxide, a tin oxide, a zinc oxide, and a titanium oxide.

The metal part 240b is the wire 240 disposed in the second area. The metal part 240b includes a metallic material and may be disposed in the second area. For example, the metal part 240b may include chromium (Cr), nickel (Ni), copper (Cu), aluminum (Al), silver (Ag), molybdenum (Mo), and an alloy thereof. The metal part 240b may not be visible through a deco layer which is disposed in the second area later.

A distance D between outmost wires 240c and 240d among the wires 240 may be equal to or greater than 90% based on a width of the substrate 100. That is, a distance D between wires 240 disposed at both ends of the substrate 100 may be equal to or greater than 90% based on the width of the substrate 100. The wires 240 may be entirely disposed in a width direction of the substrate 100.

This is because the wires 240 are connected to unit sensing electrodes 21, respectively. That is, since the wires 240 are connected to the unit sensing electrode 21 and are drawn to the second area, the wires 240 may be widely distributed in the width direction of the substrate 100.

In addition, as shown in FIGS. 10 and 11, when the wire 240 is formed only at the top end T of the touch panel, a separate printing pattern is not necessary at a bottom end of the touch panel, so the convenience of the user can be improved by enlarging the first area of the touch panel.

Meanwhile, although the embodiment of FIGS. 10 and 11 have illustrated that the wire 240 is formed at the top end of the touch panel, the wire 240 may be formed at a bottom end of the touch panel when an FPCB bonding part is provided at a bottom end of the touch panel due to a structural reason. The wire 240 may be disposed at a bottom end of the touch panel if it is advantageous for structural reasons.

Meanwhile, the wires 240 are connected to the sensing electrodes 21, respectively such that the sensing electrodes 21 can be drawn out to a top end of the touch panel. The number of wires 240 connected to the sensing electrode 21 is gradually increased from the top end of the touch panel to the bottom end of the touch panel so that the wires 240 are illustrated as being combined in FIG. 11 for the purpose of convenience. However, actually, as shown in FIG. 12, respective wires 240 are electrically isolated from each other without shorting. The touch panel will be described in detailed as follows.

Referring to FIG. 12, the touch panel according to the embodiment may include a sensing electrode 21 detecting a position of the first area. The sensing electrode 21 includes a first sensing electrode 211 and a second sensing electrode 231.

The first sensing electrode 211 may have a first pattern. In detail, the first sensing electrode 211 may include a first sub-electrode 213 and a second sub-electrode 214. The first sub-electrode 213 may extend in a first direction of the substrate 100. The second sub-electrode 214 may be bent from the first sub-electrode 213. The second sub-electrode 214 may extend in a second direction crossing the first direction.

Similarly, the second sensing electrode 231 may have a second pattern. In detail, the second sensing electrode 231 may include a third sub-electrode 233 and a fourth sub-electrode 234. The third sub-electrode 233 may extend in the first direction. The fourth sub-electrode 234 may be bent from the third sub-electrode 233. The second sub-electrode 214 may extend in the second direction.

In this case, the second sub-electrode 214 and the fourth sub-electrode 234 may be offset from each other. In detail, an end of the second sub-electrode 214 and an end of the fourth sub-electrode 234 may be offset from each other. Accordingly, the end of the second sub-electrode 214 and the end of the fourth sub-electrode 234 may not be disposed in the same line.

A bending direction of the second sub-electrode 214 is opposed to a bending direction of the fourth sub-electrode 234 based on the second direction. That is, as illustrated in FIG. 12, when the bending direction of the second sub-electrode 214 is a left direction in a drawing, the bending direction of the fourth sub-electrode 234 is a right direction in the drawing.

The fourth sub-electrodes 234 may surround the second sub-electrode 214. Further, the second sub-electrode 214 may surround the fourth sub-electrode 234. The first sensing electrode 211 may surround the fourth sub-electrode 234. That is, the first sensing electrode 211 may be engaged with the second sensing electrode 231.

The end of the second sub-electrode 214 may face the third sub-electrode 233.

Similarly, the end of the fourth sub-electrode 234 may face the first sub-electrode 213.

Through the above arrangement, a coupling area may be formed between the first sensing electrode 211 and the second sensing electrode 231.

Meanwhile, referring to FIG. 12, the second sub-electrodes 214 may be placed at both ends of the first sub-electrode 213, respectively. That is, the first sensing electrode 211 may include two sub-electrodes 214. The second sub-electrodes 214 may be bent from both ends of the first sub-electrode 213, respectively. The second sub-electrodes 214 may be disposed while being interposing the fourth sub-electrode 234 therebetween. That is, the second sub-electrodes 214 may sandwich the fourth sub-electrode 234. That is, the second sub-electrodes 214 may be placed at upper and lower portions of the fourth sub-electrode 234, respectively.

The wire 240 is electrically connected to the sensing electrode 21. The wire 240 may be electrically connected to the sensing electrode 21 such that the sensing electrode 21 can be drawn out to a top end of the first area.

In detail, the first wire 241 is connected to the first sensing electrode 211. The first wire 241 may extend to the top end of the first area.

The second wire 261 is connected to the second sensing electrode 231. The second wire 261 may extend to the top end of the first area.

A first pad part 271 connected to a circuit board FPCB is disposed at an end of the wire 240. The first pad part 271 may be bonded to the circuit board FPCB to apply an electric signal. The first pad part 271 may be placed at an end of the first wire 241 and an end of the second wire 261. That is, the first pad part 271 includes a first wire pad 242 placed at the end of the first wire 241 and a second wire pad 262 placed at the end of the second wire 261.

When a longer side and a shorter side of the substrate 100 are defined, the ground electrodes 220 may extend along the longer side of the substrate 100. That is, the ground electrodes 220 may extend in the same direction as an extension direction of the wire 240.

Meanwhile, the ground electrodes 220 may be disposed closely to the sensing electrode 21. That is, there is no other element disposed between the ground electrodes 220 and the sensing electrode 21. The ground electrodes 220 may be disposed between constituent elements of the sensing electrode 21, respectively. In detail, the ground electrodes 220 may be disposed between the first sensing electrode 211 and the second sensing electrode 231. Further, the ground electrodes 220 may be disposed between the wire 240 and the sensing electrode adjacent to the wire 240. In detail, the ground electrodes 220 may be disposed between the wire 240 connecting the first sub-electrode 213 and the third sub-electrode 233 adjacent to the wire 240. The ground electrodes 220 may prevent interference between the first sensing electrode 211 and the second sensing electrode 231.

Referring to FIG. 13, the ground electrode 220 includes second pad parts 251 and 252 to be connected to the circuit board FPCB. The second pad parts 251 and 252 are disposed at an end E1 of the ground electrode 220.

In this case, the number of the second pad parts 251 and 252 is smaller than the number of the ground electrodes 220. According to the related art, second pad parts 251 and 252 are provided at the ground electrodes 220, respectively, so that the number of the ground electrodes 220 is the same as the number of the second pad parts 251 and 252. However, in the embodiment, the number of the second pad parts 251 and 252 is smaller than the number of the ground electrodes 220.

In detail, the second pad parts 251 and 252 are placed at one end E1 of at least one of the ground electrodes 220. In more detail, the ground electrode 220 includes a first ground electrode 221 and a second ground electrode 222 disposed outermost portions of the ground electrode 220. The second pad parts 251 and 252 are placed at an end E1 of the first ground electrode 221 and an end E1 of the second ground electrode 222, respectively. That is, the second pad parts 251 and 252 include a third pad part 251 placed at the end E1 of the first ground electrode 221 and a fourth pad part 252 placed at the end E1 of the second ground electrode 222.

Accordingly, no pad part is formed at the ends E1 of a plurality of ground electrodes 220 disposed between the first ground electrode 221 and the second ground electrode 222. Thus, the number of bonding parts between the second pad parts 251 and 252 and the circuit board may be reduced. That is, a width of the bonding part is reduced so that a structure suitable for bonding may be ensured.

The other ends E2 of the ground electrodes 220, which are opposite to one ends E1, are connected to each other. That is, the other ends E1 of the ground electrodes 220 are integrally formed with each other.

Accordingly, even if the second pad parts 251 and 252 are locally provided at the ground electrodes 220, all the ground electrodes 220 may be electrically connected to the circuit board.

The ground electrodes 220 may be disposed in both of the first area and the second area. For example, referring to FIG. 13, the second ground electrode 222 may be disposed in the second area, and ground electrodes 220 except for the second ground electrode 222 may be disposed in the first area. In this case, the ground electrode 220 disposed on the first area may be transparent. That is, the ground electrode 220 disposed in the first area may be transparent so it may not degrade visibility in the first area.

Meanwhile, as shown in FIG. 15, the sensing electrode 21 and the ground electrodes 220 may be provided on one substrate 100.

However, the embodiment is not limited thereto. As shown in FIG. 16, the sensing electrode 21 and the ground electrodes 220 may be provided on an electrode base 120, and the electrode base 120 may adhere to the substrate 100. In this case, the electrode base 120 may include various bases such as a polyethylene terephthalate (PET) film. The electrode base 120 may be bonded with the substrate 100 by an adhesive layer 140. The adhesive layer 140 may include an optically clear adhesive (OCA).

Figure 17:
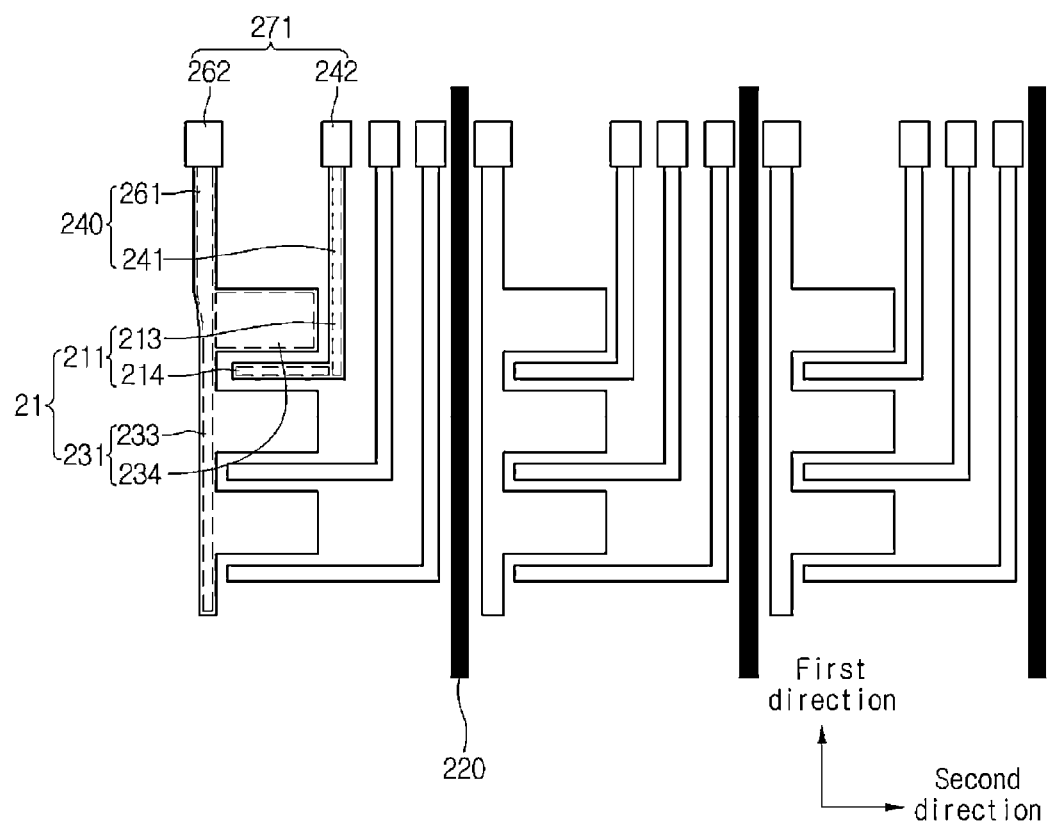
FIG. 17 is an enlarged plan view illustrating a region corresponding to 'B' in FIG. 12, but according to another embodiment.

Meanwhile, referring to FIG. 17, the sensing electrode 211 includes a first sub-electrode 213 and a second sub-electrode 214 integrally formed with the first sub-electrode 213. That is, the second sub-electrode 214 may be bent from one end of the sub-electrode 213.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch panel comprising:
a substrate including a first area and a second area on at least one side of the first area;
a sensing electrode disposed on the substrate to detect a position;
a wire connected to the sensing electrode;
a plurality of ground electrodes disposed closely to the sensing electrode; and
a pad part placed at one end of at least one of the ground electrodes and connected to a circuit board,
wherein a number of the pad parts is smaller than a number of the ground electrodes;
wherein the second area is formed at a top end or a bottom end of the first area;
wherein the sensing electrode is disposed in the first area;
wherein the wire is disposed in both the first area and the second area;
wherein one part of the wire comprises a transparent part and a remaining part of the wire comprises a metal part;
wherein the transparent part of the wire is disposed in the first area;
wherein the transparent part comprises a transparent conductive oxide;
wherein the metal part of the wire is disposed in the second area;
wherein the metal part comprises a metallic material;
wherein the pad part is disposed in the second area;
wherein an FPCB bonding part is disposed in the second area;
wherein a printing pattern is disposed in the second area;
wherein the ground electrodes are disposed in both the first area and the second area;
wherein each ground electrode disposed in the first area is transparent; and wherein the printing pattern is disposed at a position corresponding to the metal part, the pad part, and the FPCB bonding part.

2. The touch panel of claim 1, wherein opposite ends of the ground electrodes, which are opposite to the one ends of the ground electrodes, are connected to each other.

3. The touch panel of claim 2, wherein the opposite ends of the ground electrodes are integrally formed with each other.

4. The touch panel of claim 1, wherein the ground electrode comprises a first ground electrode and a second ground electrode disposed at outermost portions of the ground electrode, and the pad part comprises a first pad connected to one end of the first ground electrode and a second pad connected to one end of the second ground electrode.

5. The touch panel of claim 1, wherein a distance between outmost wires among the wires is equal to or greater than 90% based on a width of the substrate.

6. The touch panel of claim 1, wherein the sensing electrode and the ground electrodes are directly placed on the substrate.

7. The touch panel of claim 1, further comprising an electrode base spaced apart from the substrate, wherein the sensing electrode and the ground electrodes are placed on the electrode base.

8. The touch panel of claim 1, wherein the transparent conductive oxide comprises one of indium tin oxide, indium zinc oxide, copper oxide, tin oxide, zinc oxide, and titanium oxide.

9. The touch panel of claim 1, wherein the metallic material comprises at least one of chromium (Cr), nickel (Ni), copper (Cu), aluminum (Al), silver (Ag), and molybdenum (Mo).

* * * * *